United States Patent
Okada et al.

(10) Patent No.: US 7,619,292 B2
(45) Date of Patent: Nov. 17, 2009

(54) SEMICONDUCTOR INTEGRATED DEVICE HAVING SOLID-STATE IMAGE SENSOR PACKAGED WITHIN AND PRODUCTION METHOD FOR SAME

(75) Inventors: Yoshihiro Okada, Hashima (JP); Takahiko Ogo, Hashima (JP); Kaoru Sasaki, Iwami-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 24 days.

(21) Appl. No.: 12/041,530

(22) Filed: Mar. 3, 2008

(65) Prior Publication Data

US 2008/0203513 A1   Aug. 28, 2008

Related U.S. Application Data

(62) Division of application No. 10/530,095, filed as application No. PCT/JP03/14516 on Nov. 14, 2003, now Pat. No. 7,361,525.

(30) Foreign Application Priority Data

Nov. 19, 2002   (JP)   ............................ 2002-334585

(51) Int. Cl.
*H01L 31/02*   (2006.01)
(52) U.S. Cl. .................. 257/435; 257/E31.127
(58) Field of Classification Search ................. 257/434, 257/620
See application file for complete search history.

(56) References Cited

U.S. PATENT DOCUMENTS

| | | | |
|---|---|---|---|
| 5,461,008 A | 10/1995 | Sutherland et al. | ............. 83/15 |
| 5,606,198 A | 2/1997 | Ono et al. | |
| 6,316,287 B1 * | 11/2001 | Zandman et al. | ............ 438/113 |
| 6,354,909 B1 | 3/2002 | Boucher et al. | ............... 451/12 |
| 6,454,190 B1 | 9/2002 | Cook | ......................... 239/553 |
| 6,652,997 B2 | 11/2003 | Suzuki et al. | |
| 6,812,581 B2 | 11/2004 | Matsuyama et al. | |
| 7,046,282 B1 * | 5/2006 | Zhang et al. | ................. 348/294 |
| 7,101,735 B2 * | 9/2006 | Noma et al. | ................. 438/114 |

(Continued)

FOREIGN PATENT DOCUMENTS

JP   2000-077646   3/2000

(Continued)

OTHER PUBLICATIONS

ShellOP Process Flow (Oct. 2001) <url: http://www.shellcase.com/pages/products-shellOP-process.asp>.

(Continued)

*Primary Examiner*—Nathan W Ha
(74) *Attorney, Agent, or Firm*—Hogan & Hartson LLP

(57) ABSTRACT

A semiconductor integrated device comprises: a light-shielding film which shields at least some part of a transfer section of the semiconductor integrated device from light; a first wiring formed in the same layer as the light-shielding film, with one end connected to a pad electrode and an other end extended to a side edge of the semiconductor substrate; a second wiring arranged to go around a side face of the semiconductor substrate, and connected to the first wiring; and a sealing member which seals the solid-state image sensor.

6 Claims, 11 Drawing Sheets

U.S. PATENT DOCUMENTS

| | | | |
|---|---|---|---|
| 7,476,904 B2 * | 1/2009 | Fukunaga | 257/80 |
| 7,510,917 B2 * | 3/2009 | Zhang et al. | 438/154 |
| 2002/0047210 A1 | 4/2002 | Yamada et al. | |
| 2003/0008174 A1 | 1/2003 | Suzuki et al. | |
| 2003/0209772 A1 * | 11/2003 | Prabhu | 257/434 |
| 2003/0216010 A1 * | 11/2003 | Atlas | 438/462 |
| 2004/0012095 A1 | 1/2004 | Matsuyama et al. | |
| 2004/0121562 A1 | 6/2004 | Wakui et al. | |
| 2004/0137723 A1 * | 7/2004 | Noma et al. | 438/667 |
| 2007/0215204 A1 | 9/2007 | Maehara | 136/256 |
| 2008/0171421 A1 * | 7/2008 | Suzuki et al. | 438/459 |

FOREIGN PATENT DOCUMENTS

| | | |
|---|---|---|
| JP | 2000077646 A | 3/2000 |
| JP | 2001-223288 | 8/2001 |
| JP | 2002-198463 | 7/2002 |
| JP | 2002198463 A | 7/2002 |
| JP | 2002-329852 | 11/2002 |
| JP | 2002329582 A | 11/2002 |
| JP | 2003-347476 | 12/2003 |
| JP | 2003347476 A | 12/2003 |

OTHER PUBLICATIONS

Japanese office action and its English language translation for corresponding Japanese application 2002334585 lists the references above.

* cited by examiner

US 7,619,292 B2

SEMICONDUCTOR INTEGRATED DEVICE HAVING SOLID-STATE IMAGE SENSOR PACKAGED WITHIN AND PRODUCTION METHOD FOR SAME

CROSS-REFERENCE TO THE RELATED APPLICATIONS

This application is a divisional of application Ser. No. 10/530,095 filed Apr. 1, 2005, which is a national stage of international application No. PCT/JP2003/014516 filed on Nov. 14, 2003, which also claims benefit of priority under 35 U.S.C. § 119 to Japanese Patent Application No. 2002-334585 filed Nov. 19, 2002, the entire contents of which are incorporated herein by reference.

TECHNICAL FIELD

The present invention relates to a semiconductor integrated device having a solid-state image sensor packaged within and a production method for the same.

BACKGROUND ART

Recently, chip size packages have been widely used in order to miniaturize the chip size of solid-state image sensors.

Firstly, a solid-state image sensor is described here. FIG. 10 is a plan view showing the construction of a solid-state image sensor.

A solid-state image sensor, in the case of a frame transfer type for example, is essentially composed of a light receiving section 200, a storage section 202, a horizontal transfer section 204, an output section 206 and an output amplifier 208. The light receiving section 200 has a plurality of light receiving pixels arranged in a matrix, and stores information charges, which are generated in response to receiving light, in each respective light receiving pixel. The storage section 202 has a plurality of storage pixels arranged according to the number of light receiving pixels of the light receiving section 200, and takes in and temporarily stores information charges of one image stored in the light receiving section 200. The horizontal transfer section 204 takes in information charges from the storage section 202 in units of one line, and transfers them horizontally one pixel at a time. The output section 206 converts the information charges transferred from the horizontal transfer section 204 to voltage value and outputs them in units of one pixel. The output amplifier 208 amplifies the voltage value outputted from the output section 206, and outputs it as an image signal.

A solid-state image sensor having such a construction has a diffusion layer on the semiconductor substrate surface and electrodes arranged on the substrate, and comprises the light receiving section 200, the storage section 202, the horizontal transfer section 204, the output section 206 and the output amplifier 208, and lastly has a light-shielding film, which blocks light, arranged in all areas except for the light receiving section 200 (the hatched area in the diagram).

Next, a semiconductor integrated device in which a chip-sized package is applied for the solid-state image sensor is described. FIG. 11 is a cross-sectional view of the semiconductor integrated device cut along a position corresponding to the line X-X in FIG. 10.

A P-type diffusion layer 302 is formed on the surface of an N-type semiconductor substrate 300, and an N-type diffusion layer 304 is formed in this P-type diffusion layer 302. Highly concentrated P-type impurities are implanted in places in the N-type diffusion layer 304, and a channel stopper (not shown) is formed. Then, a transfer electrode 306 is formed on the semiconductor substrate 300 having an insulation film 305 in between, and the solid-state image sensor is formed.

An insulation film 308 is laminated on the transfer electrode 306, and a voltage supply line 310 and a pad electrode 322 are formed on this insulation film 308. This voltage supply line 310 and pad electrode 322 are electrically connected to the transfer electrode 306 via a contact formed in the insulation film 308. Moreover, an insulation film 312 is laminated on the voltage supply line 310 and the pad electrode, and an internal wiring 314 is formed on the insulation film 312. This internal wiring 314 is, on its cross-sectional surface, connected to an external wiring 110 arranged along the side face of the package. An insulation film 316 is laminated on the internal wiring 314, and a light-shielding film 318 is arranged in the area covering the storage section 202, the horizontal transfer section 204 and the output section 206 on this insulation film 316. Then, a surface protection film 320, covering the light-shielding film 318 and the insulation film 316, is formed.

DISCLOSURE OF THE INVENTION

The contact resistance of the connection place, between the internal wiring 314 of the sensor and the external wiring 110, needs to be kept sufficiently low. Usually, the thickness of the voltage supply line is approximately 1 µm, and as this thickness is insufficient to directly connect to the external wiring 110, an additional internal wiring 314 having greater thickness has needed to be provided.

In this case, since an additional process for forming the internal wiring 314 is required, production throughput of the solid-state image sensor is reduced, and the problem of a rise in production cost had arisen.

Also, the end part of the internal wiring 314 can easily become corroded from outside the sensor and there has been the problem of a reduction in the strength of the connection with the external wiring 110 when corroded.

In consideration of the problems of the conventional art mentioned above, an object of the present invention is to provide a semiconductor integrated device that is capable of solving at least one of abovementioned issues, and that does not undermine the characteristics of the sensor, and that can be formed easily; and a production method for the same.

The present invention is a semiconductor integrated device comprising: a solid-state image sensor having on a semiconductor substrate, a light receiving section which receives light and generates information charges, and a transfer section which transfers information charges stored in the light receiving section; and wherein a voltage is supplied through a pad electrode arranged along one edge of the semiconductor substrate; a light-shielding film which is formed on the semiconductor substrate and which shields at least some part of the transfer section from light; a first wiring formed in the same layer as the light-shielding film, with one end connected to the pad electrode and an other end extended to a side edge of the semiconductor substrate; a second wiring arranged to go around a side face of the semiconductor substrate, and connected to the first wiring; and a sealing member which seals the solid-state image sensor.

Another aspect of the present invention is characterized in that in a production method for a semiconductor integrated device in which an end part of a first wiring extends to a side edge of a solid-state image sensor, and in which this first wiring is connected to a second wiring arranged to go around a side face of the solid-state image sensor, the method includes: a first process in which a light receiving section which receives light and generates information charges, and a transfer section which transfers information charges stored in the light receiving section, are formed, and then the solid-state image sensor is formed on the semiconductor substrate; a second process in which a light-shielding film which shields at least the transfer section, is formed on the semiconductor substrate, and the first wiring is formed in the same layer as the light-shielding film; and a third process in which the second wiring is formed and connected to the first wiring.

Another aspect of the present invention is characterized in that in a production method for a semiconductor integrated device in which an end part of an internal wiring extends to a side edge of a solid-state image sensor, and in which this internal wiring is connected to an external wiring arranged to go around a side face of the solid-state image sensor, the method includes: a first process in which a light receiving section which receives light and generates information charges, and a transfer section which transfers information charges stored in the light receiving section, are formed, and then the solid-state image sensor is formed on the semiconductor substrate; a second process in which a pad electrode which supplies voltage to the light receiving section and to the transfer section, is formed while a first internal wiring is formed in the same layer as the pad electrode; a third process in which a light-shielding film which shields at least the transfer section, is formed on the semiconductor substrate while the second internal wiring which overlaps the first internal wiring, is formed in the same layer as the light-shielding film; and a fourth process in which an external wiring is formed and then the first internal wiring and the second internal wiring are connected.

BEST MODE FOR CARRYING OUT THE INVENTION

In connection with describing an embodiment of the present invention, firstly, the basic construction of a semiconductor integrated device having a solid-state image sensor packaged within is described.

Figure 2A:
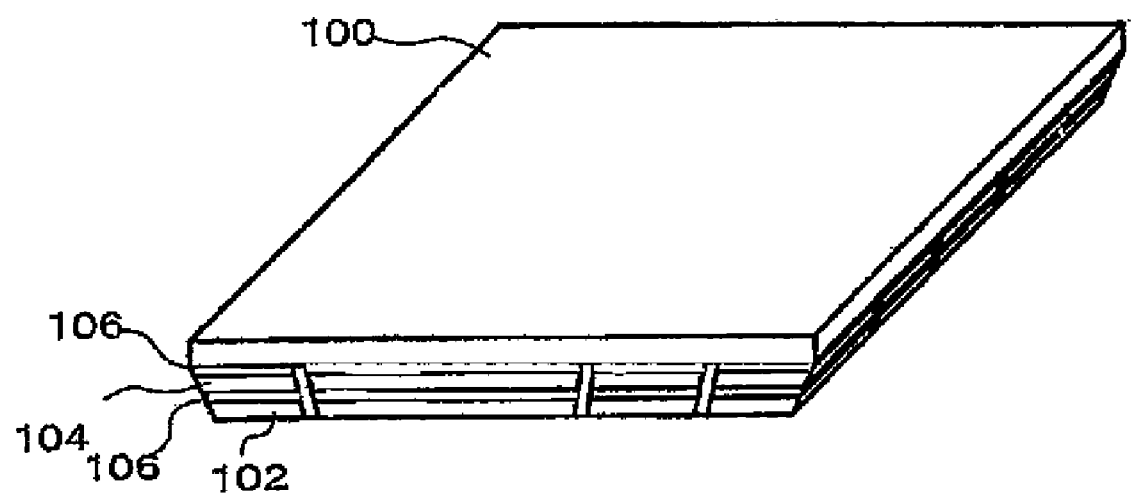
FIG. 2A and FIG. 2B are perspective views showing the package appearance of the semiconductor integrated device of the embodiment of the present invention.
Figure 2B:
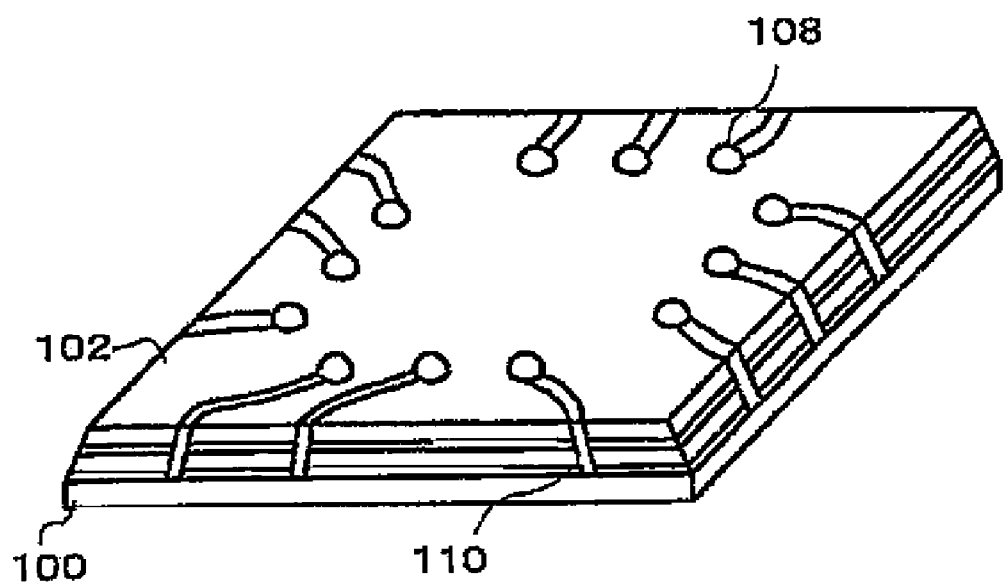

FIG. 2A and FIG. 2B are perspective views showing one example of a semiconductor integrated device in which a chip-sized package is applied for the solid-state image sensor. A solid-state image sensor chip 104 is sealed between resin films 106, between a first and a second glass substrate 100 and 102. A plurality of ball-shaped terminals 108 are arranged on the main face of the second glass substrate, that is, the back side of the device, and these ball-shaped terminals 108 are connected to the solid-state image sensor chip 104 via an external wiring 110. A plurality of the external wirings 110 are connected to wirings drawn out from the solid-state image sensor chip 104, and establish contacts with each respective ball-shaped terminal 108.

Figure 1:
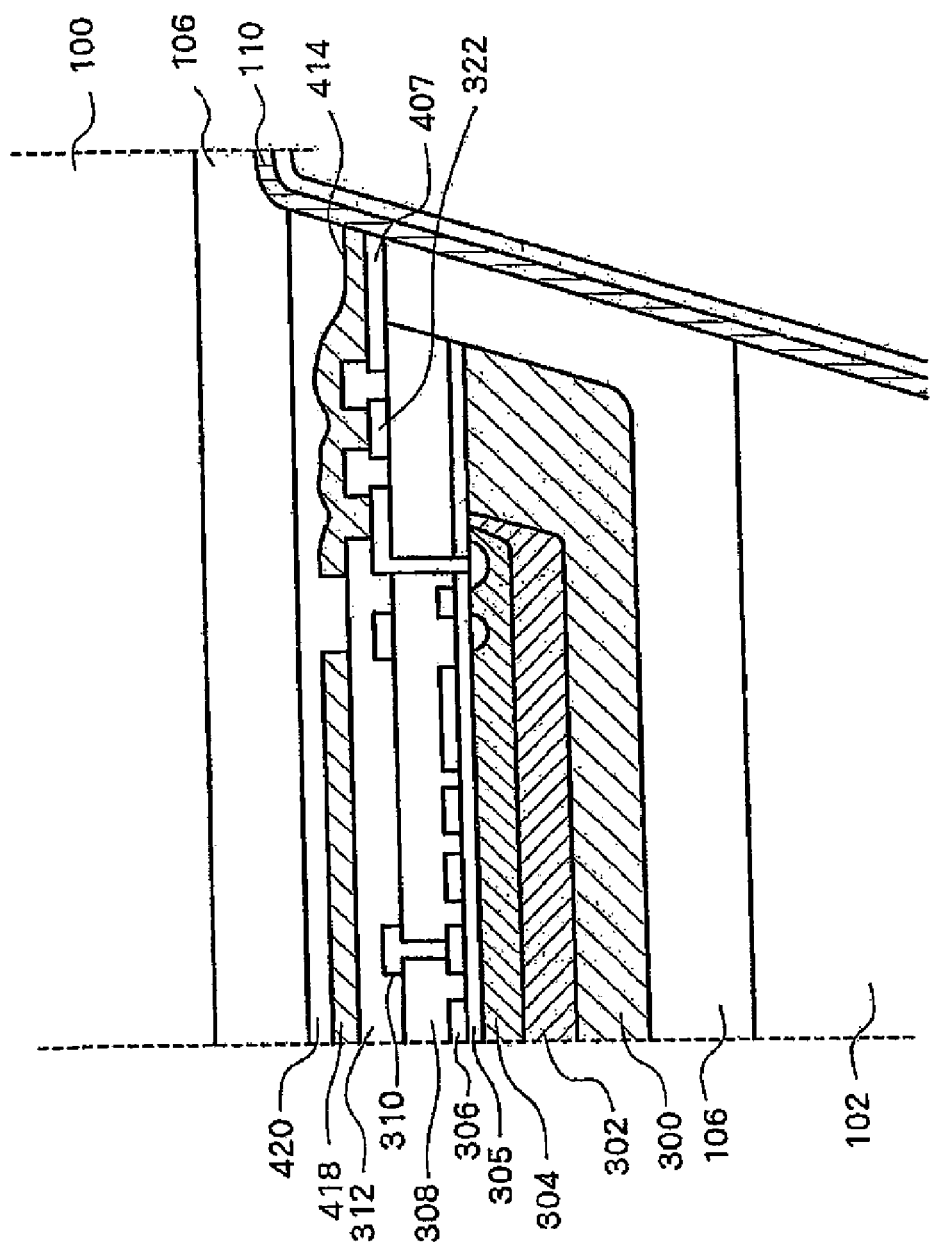
FIG. 1 is a view showing the cross-sectional construction of a semiconductor integrated device of an embodiment of the present invention.
Figure 10:
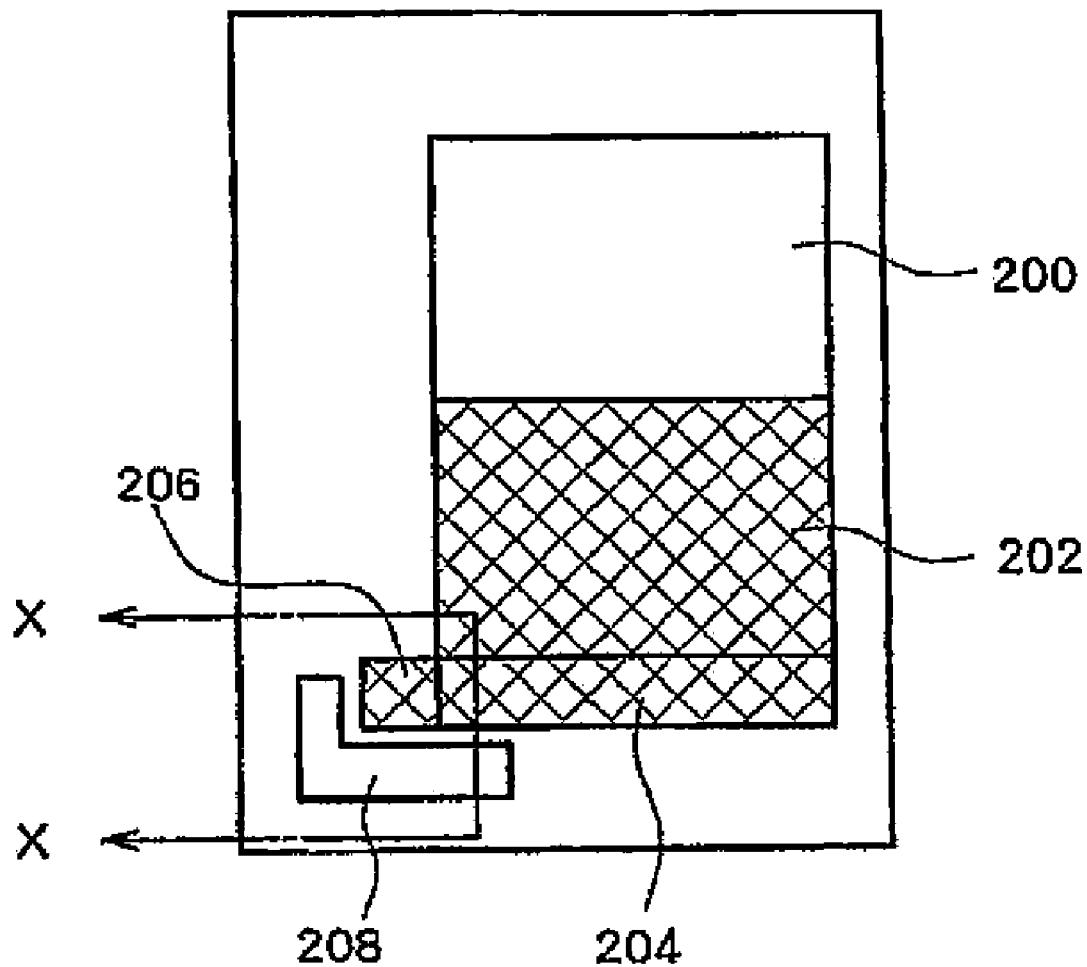
FIG. 10 is a plan view showing the construction of a conventional solid-state image sensor.
Figure 11:
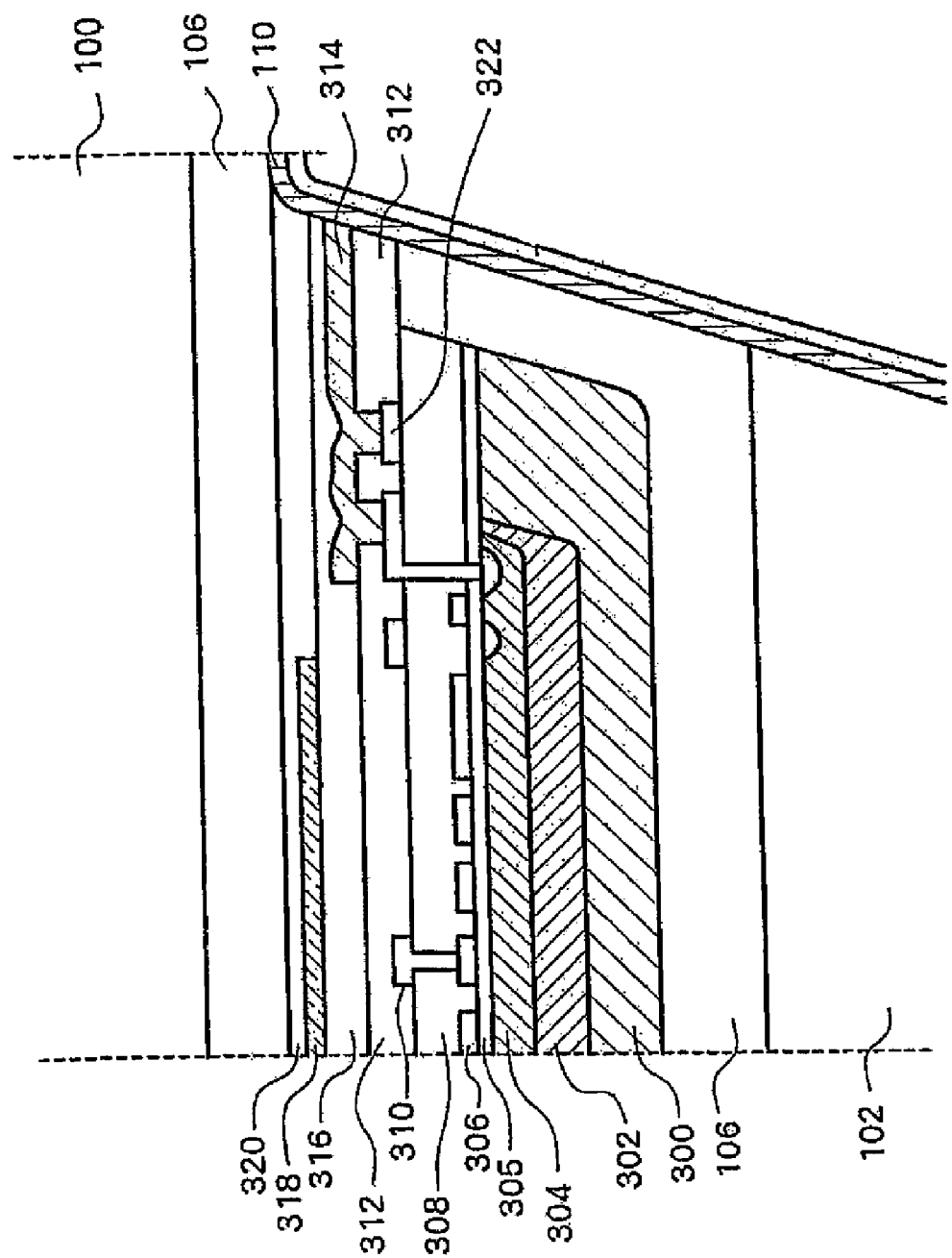
FIG. 11 is a view showing the cross-sectional construction of a conventional semiconductor integrated device.

Next, the embodiment of the invention of the present application is described. FIG. 1 is a view showing the cross-sectional construction of the semiconductor integrated device of the embodiment of the invention of the present application. FIG. 1 is a cross sectional view of a semiconductor integrated device cut at a position corresponding to the line X-X of FIG. 10. The same reference symbols are given to constructions the same as those shown in FIG. 2A, FIG. 2B, FIG. 10 and FIG. 11.

A P-type diffusion layer 302 is formed on an N-type semiconductor substrate 300, and an N-type diffusion layer 304 is formed in this P-type diffusion layer 302. Highly dense P-type impurities are partially implanted in the N-type diffusion layer 304 and a channel stopper (not shown) is formed. Then, a transfer electrode 306 is arranged on the semiconductor substrate 300 having the insulation film 305 in between.

An insulation film 308 is laminated on the transfer electrode 306, and a voltage supply line 310 and a first internal wiring 407 are formed on this insulation film 308. This voltage supply line 310 and first internal wiring 407 are formed in the same layer, and of these, the first internal wiring 407 is formed at the end part on the periphery side of the package.

A second internal wiring 414 and a light-shielding film 418 are arranged on the voltage supply line 310, an pad electrode 322 and the first internal wiring 407, having an insulation film 312 in between. The second internal wiring 414 is formed extending from a predetermined position to the end part of the package, and is made to connect to the first internal wiring 407 at the end part of the package. Moreover, the second internal wiring 414 is connected to an external wiring 110 where it overlaps with the first internal wiring 407. A light-shielding film 418 is arranged to cover the area of the storage section 202, the horizontal transfer section 204 and the output section 206, and it prevents light from entering to the storage section 202, the horizontal transfer section 204 and the output section 206. An insulation film 420 is laminated on the light-shielding film and the second internal wiring 414, and also, a first glass substrate 100 is arranged above them, sandwiching the resin film 106 in between.

According to this kind of construction, the contact area of the external wiring 110 and the internal wiring becomes greater compared to that of the conventional construction, so that the connection strength between the external wiring 110 and the internal wiring can be improved. Also, since the second internal wiring 414 that constitutes part of the internal wiring is formed in the same layer as the light-shielding film 418, the second internal wiring 414 can be formed at the same time while using the forming process of the light-shielding film 418. Consequently, the connection strength between the external wiring 110 and the internal wiring can be improved without incurring additional production process.

Furthermore, materials generally used for semiconductor devices, such as silver, gold, copper, aluminum, nickel, titanium, tantalum, and tungsten, may be used as the chief material for the voltage supply line 310, the pad electrode 322 and the light-shielding film 418. When taking into account electrical resistance value and processability of material, it is preferable to employ aluminum. Also, the end parts of the first internal wiring 407 and the second internal wiring 414 can easily become corroded from outside the sensor, and in order to avoid such corrosion, it is more preferable to employ aluminum containing copper in a range no less than 0.1 atomic percent and no more than 20 atomic percent.

Since the minimum process line width of the electrode needs to be kept small and the electrical resistance value needs to be kept sufficiently low, it is preferable that the thickness of the voltage supply line 310 and the pad electrode 322 be made no less than 0.5 μm and no more than 2 μm. Moreover, it is even more preferable that it be made no less than 0.5 μm and no more than 1 μm.

On the other hand, since the light-shielding film 418 does not require a minimum process line width made that small, and needs to sufficiently block unwanted light, it can be made thicker than the voltage supply wiring layer. Taking into account the throughput of the production process, it is preferable that it be made no less than 1.5 μm and no more than 8 μm when aluminum is the chief material. Moreover, it is even more preferable that it be made no less than 2.0 μm and no more than 8 μm.

Specifically, the total thickness of the first internal wiring 407 and the second internal wiring 414, which is the connection point with the external wiring, is preferably made no less than 2 μm at the least and no more than 10 μm, and thus, the connection strength can be improved while the contact resistance when connected to the external wiring 110 on the side face of the solid-state image sensor is kept low, at the same level as that of the conventional internal wiring 314.

Figure 3:
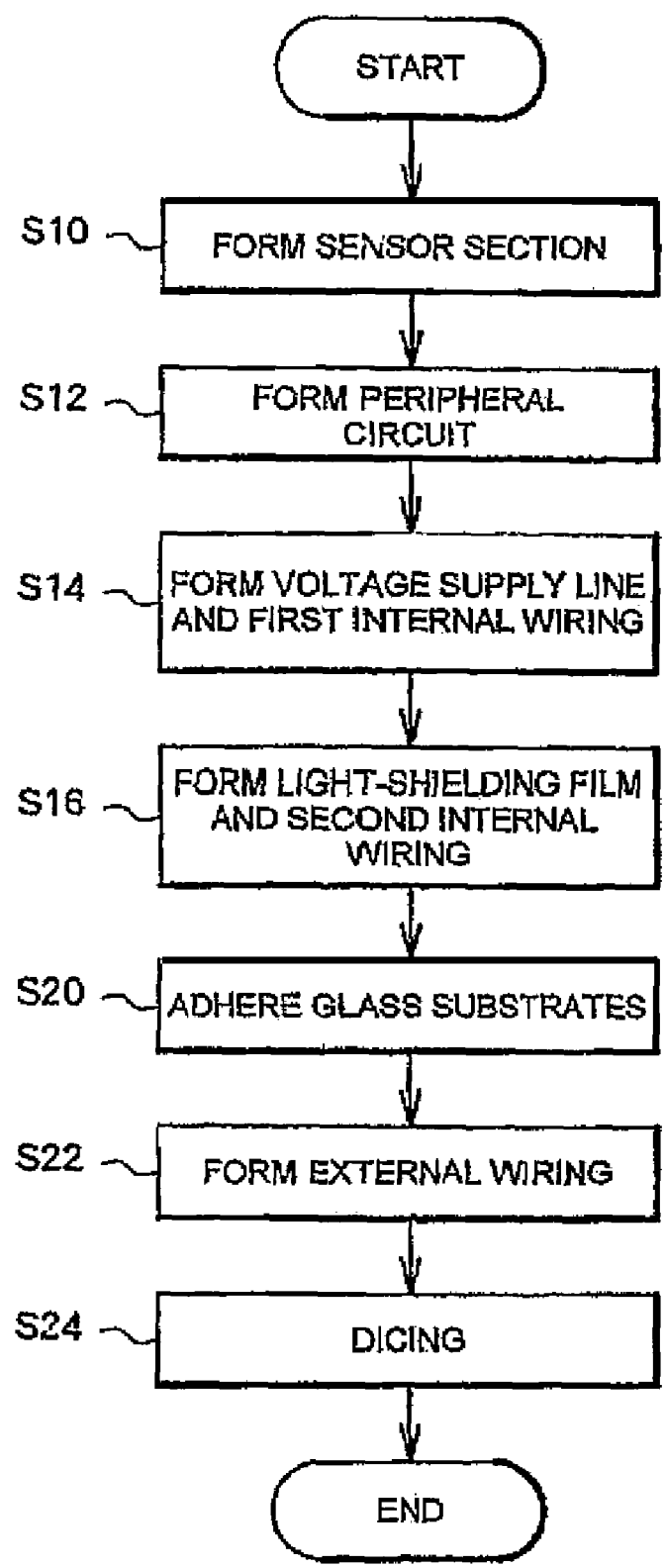
FIG. 3 is a flow chart illustrating a production method for the semiconductor integrated device of the embodiment of the present invention.

FIG. 3 is a flow chart describing a production method for the semiconductor integrated device of the invention of the present application, and FIG. 4 to FIG. 9 are cross-sectional views of the semiconductor integrated device, corresponding to each production process.

Figure 4:
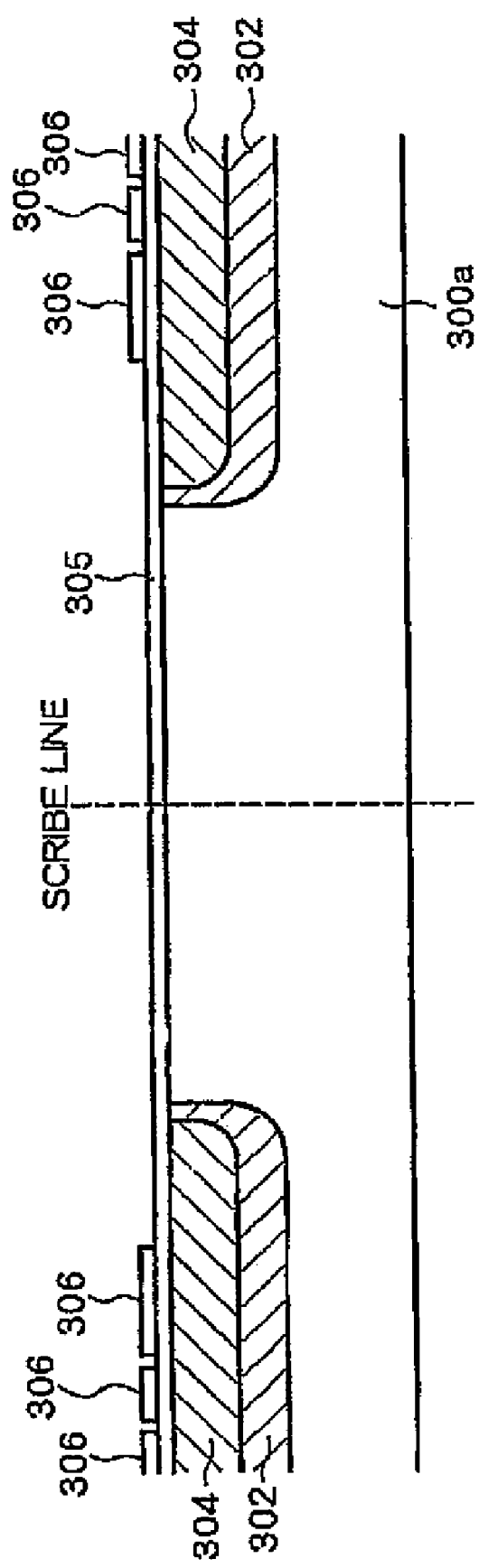
FIG. 4 is a diagram illustrating a production process of the semiconductor integrated device of the embodiment of the present invention.

In step S10, the light receiving section 200 which is a sensor section, the storage section 202, the horizontal transfer section 204 and the output section 206 are formed. Firstly, P-type impurity ions are implanted and diffused in the surface of the N-type semiconductor substrate 300a in wafer condition, and a P-type semiconductor area 302 is formed. Then, N-type impurity ions are implanted and diffused in the P-type semiconductor area 302 and an N-type semiconductor area 304 is formed. Then, the insulation film 305 and the transfer electrode 306 are formed on the semiconductor substrate 300a by appropriately combining deposition techniques such as sputtering and a chemical vapor phase growth method, and photolithography techniques. Then, highly concentrated P-type impurity ions are implanted in parts of the semiconductor area 304 to form the channel stopper (not shown), and the state as shown in FIG. 4 is reached.

Figure 5:
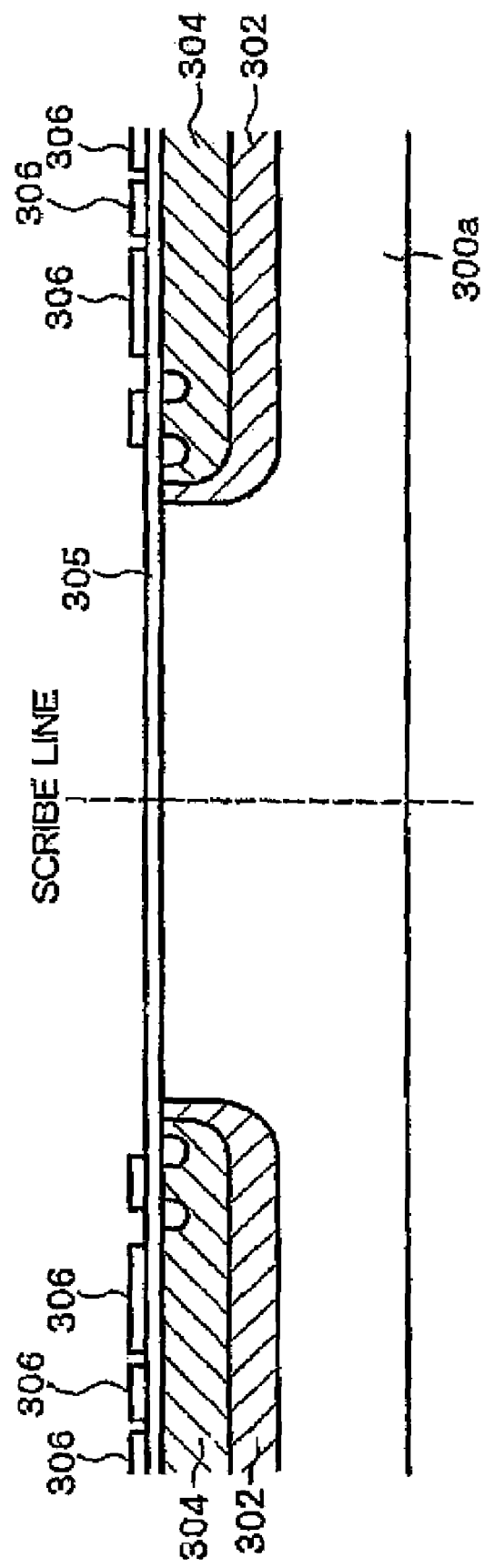
FIG. 5 is a diagram illustrating the production process of the semiconductor integrated device of the embodiment of the present invention.

In step S12, the peripheral circuit of the output amplifier 208 is formed in the area near the sensor section as shown in FIG. 5. Forming the peripheral circuit can be carried out in the same manner as the conventional process for forming a transistor.

For example, a source area and a drain area are formed by means of doping techniques such as thermal diffusion and ion implantation, and a thermally-oxidized film which becomes a gate insulation film is formed by means of thermal oxidation. Then, a polysilicon layer or a metal film, which becomes a source electrode (not shown), a drain electrode (not shown) and a gate electrode, are formed by combining photolithography techniques and deposition techniques such as a chemical vapor phase growth method.

Figure 6:
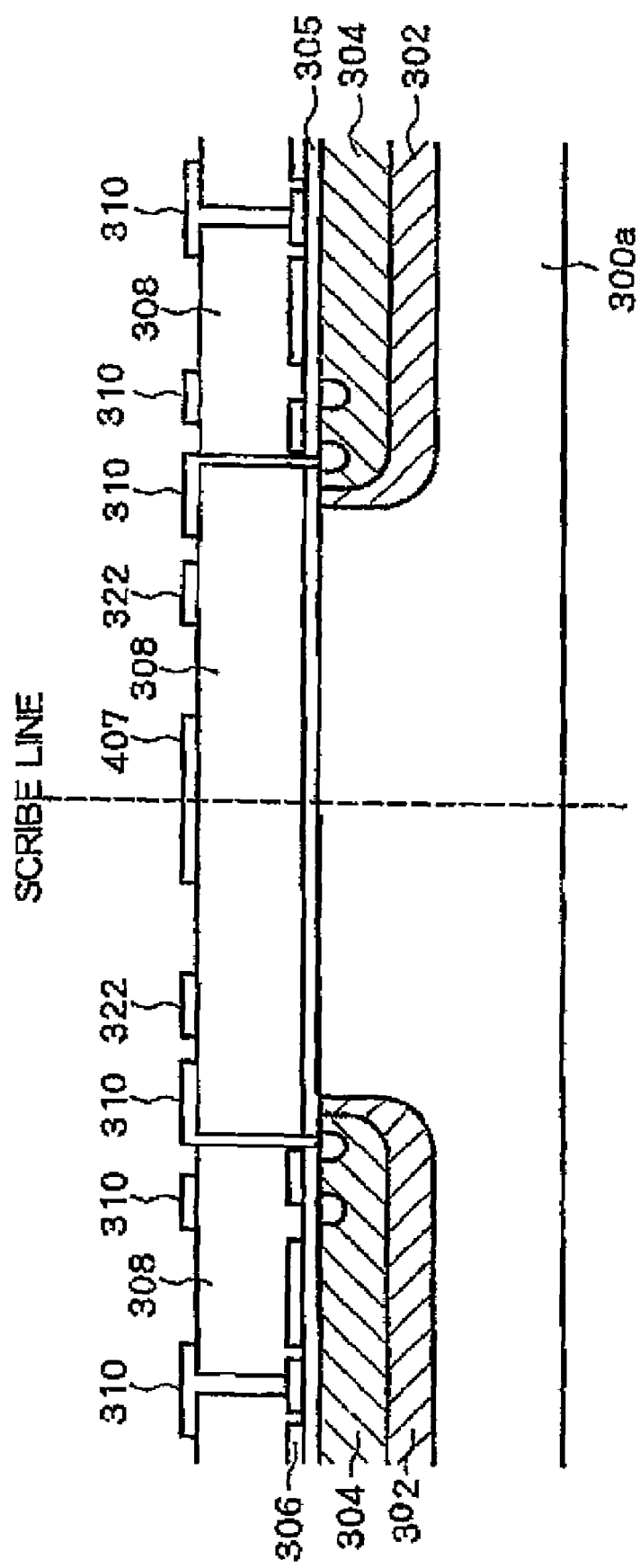
FIG. 6 is a diagram illustrating the production process of the semiconductor integrated device of the embodiment of the present invention.

In step S14, the voltage supply line 310 and the first internal wiring 407 are formed as shown in FIG. 6. A metal layer, which becomes the voltage supply line 310 that transmits externally supplied voltage, is formed. At the same time, the first internal wiring 407 is also formed making use of the metal layer.

Specifically, the interlayer insulation film 308 upon which the voltage supply line 310 and the first internal wiring 407 are to be formed, is formed on the semiconductor substrate 300a. Then, aperture holes are provided in necessary places on the interlayer insulation film 308 by means of a photolithography technique, and the metal layer is formed by means of a deposition technique such as sputtering or a chemical vapor phase growth method. Then, the voltage supply line 310 and the first internal wiring 407 are formed by patterning the metal layer.

For example, the metal layer can be formed by means of aluminum sputtering. In this case the voltage supply line 310 and the first internal wiring 407 can be formed to have high resistance to corrosion by employing aluminum containing no less than 0.1 atomic percent and no more than 20 atomic percent of copper as the target material.

Furthermore, the voltage supply line 310 and the first internal wiring 407 can also be formed by using deposition. In this case, the voltage supply line 310 and the first internal wiring 407 can be formed to have high resistance to corrosion by employing aluminum containing no less than 0.1 atomic percent and no more than 20 atomic percent of copper as the material at this point.

Furthermore, the voltage supply line 310 and the first internal wiring 407 can be formed using a chemical vapor phase growth method. In this case, an aluminum film containing no less than 0.1 atomic percent and no more than 20 atomic percent of copper and having high corrosion resistance can be formed by adjusting the proportions of a mix of an organic gas containing aluminum and an organic gas containing copper.

Figure 7:
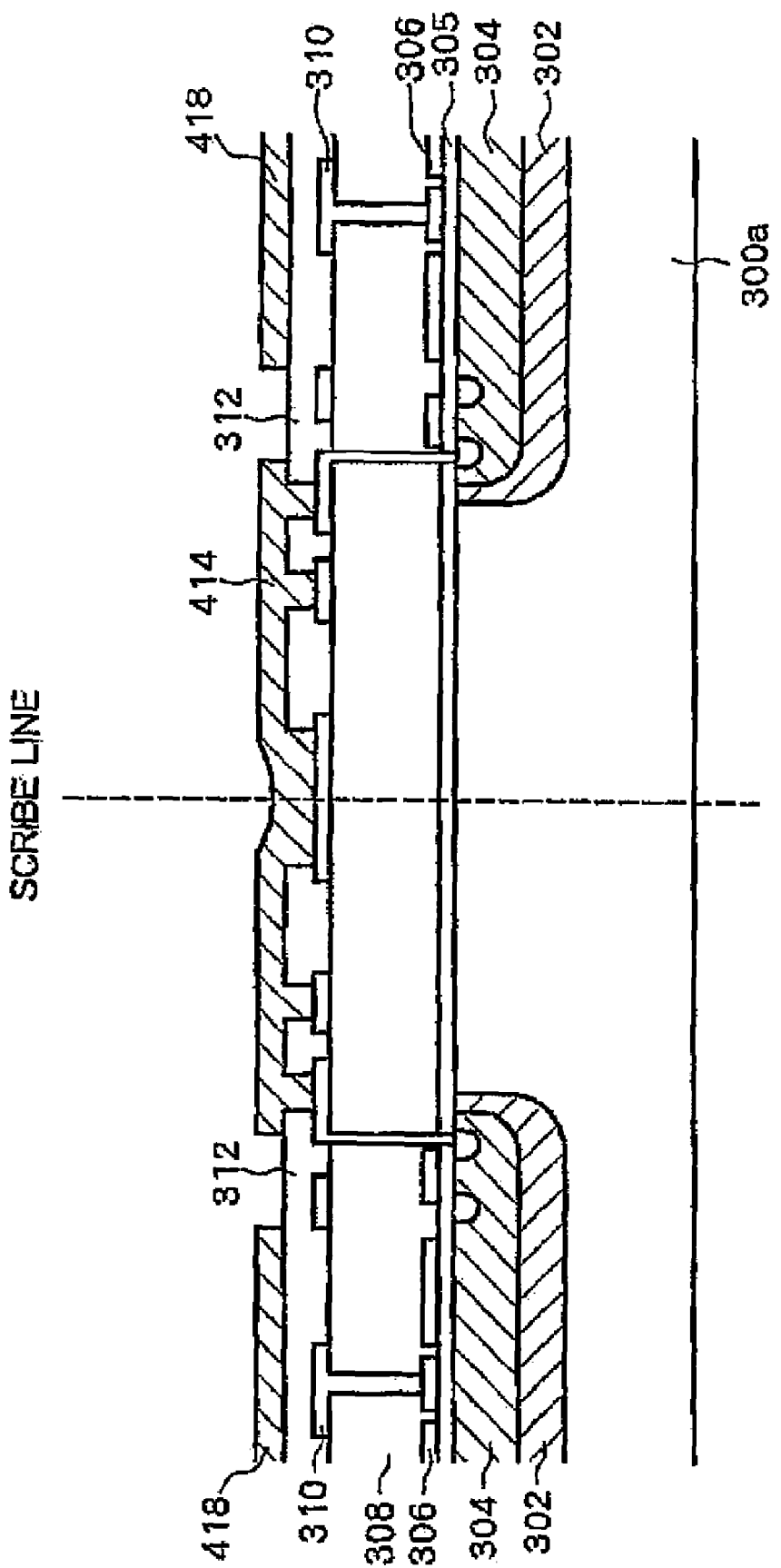
FIG. 7 is a diagram illustrating the production process of the semiconductor integrated device of the embodiment of the present invention.

In step S16, the light-shielding film 418 and the second internal wiring 414 are formed as shown in FIG. 7.

Firstly, the interlayer insulation film 312 is formed. Then, aperture holes are provided in necessary places on the sensor section and the peripheral circuit by means of a photolithography technique or similar, and the metal layer is formed by means of a vapor deposition technique such as sputtering or a chemical vapor phase growth method. Then, the second internal wiring 414 and the light-shielding film 418 are formed by patterning the metal layer.

At this point, as with the voltage supply line 310, it is preferable to form the metal layer by means of sputtering, vapor deposition or a chemical vapor phase growth method, and to form an aluminum film, containing no less than 0.1 atomic percent and no more than 20 atomic percent of copper, and having a high resistance to corrosion.

Figure 8:
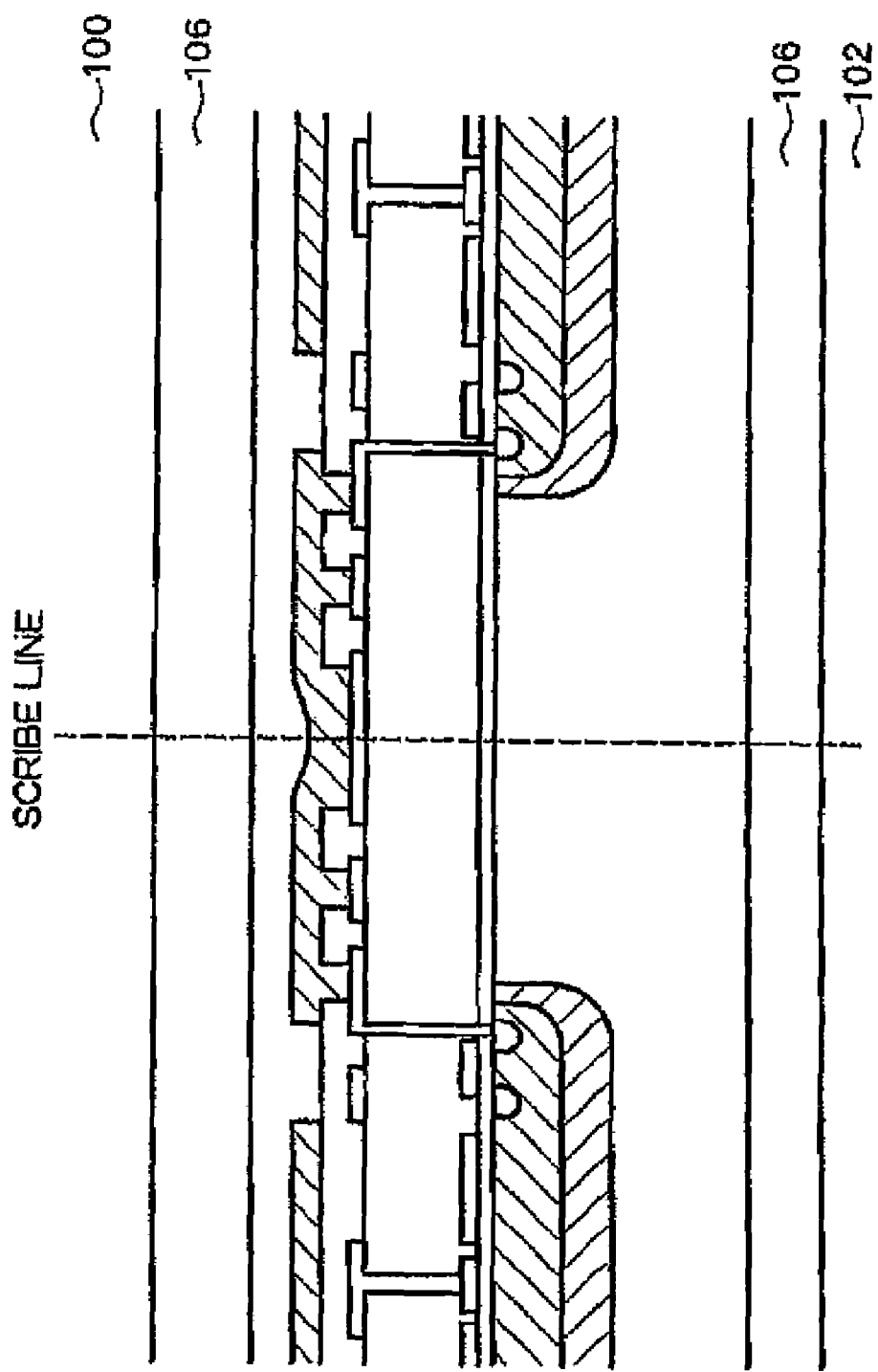
FIG. 8 is a diagram illustrating the production process of the semiconductor integrated device of the embodiment of the present invention.

In step S20, the first and second glass substrates 100 and 102 are adhered by the resin films 106 as shown in FIG. 8. In the process of this step S20, for example, epoxy resin is generally used to adhere the glass plates.

Figure 9:
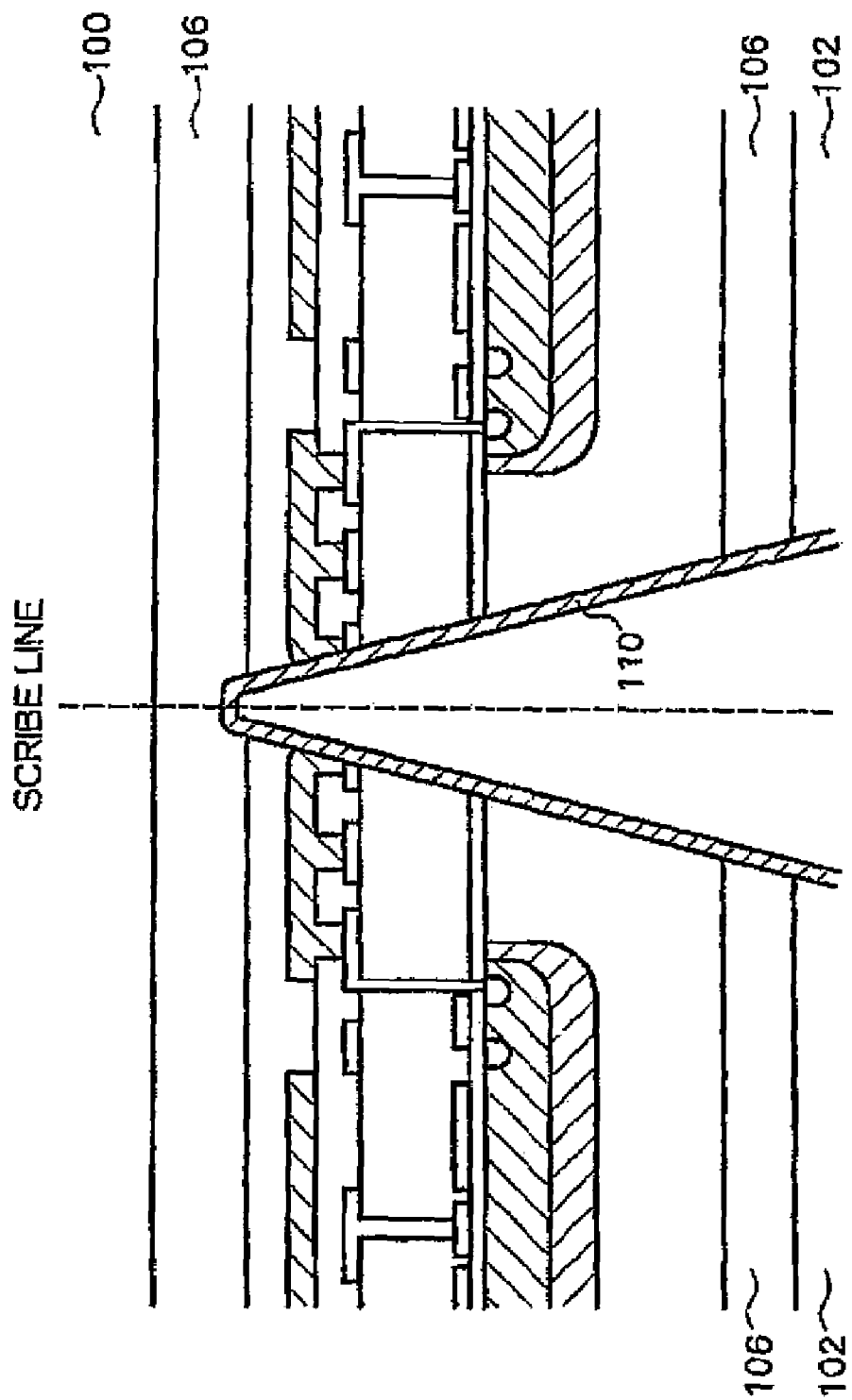
FIG. 9 is a diagram illustrating the production process of the semiconductor integrated device of the embodiment of the present invention.

In step S22, the external wiring 110 is formed as shown in FIG. 9. Firstly, an inverted V groove is formed by cutting from the second glass substrate 102 side using a tapered dicing saw, and the first and second internal wiring 407 and 414 are exposed out of the inner face of the groove. Then, a metal layer is formed on the inner face of the groove by means of sputtering, vapor deposition, or a chemical vapor phase growth method, and the external wiring 110 is formed by pattering this metal layer. After this, the ball-shaped terminals 108 are formed so as to connect to the external wiring on the surface of the second glass substrate 102.

In step S24, the laminate formed in step S22 is diced along the scribe line; that is, the border line of each solid-state image sensor. As a result, the semiconductor integrated device is completed.

As described above, according to the production method for the semiconductor integrated device of the present embodiment, since the light-shielding film 418 and the internal wiring are formed in the same process, the process of forming the internal wiring can be omitted compared to in the conventional production method. Consequently, the production process can be simplified, and the solid-state image sensor package can be efficiently produced. Also, since internal wiring is formed in two stages for the first and second internal wirings 407 and 414, and has a two-layer construction, the connection strength with the external wiring 110 can be improved.

According to the present invention, in a semiconductor integrated device in which the internal wiring is connected to the external wiring arranged along the side face of the package, a semiconductor integrated device, for which the production process can be simplified without undermining the characteristics of the sensor, and a production method for the same can be provided.

Furthermore, although a frame transfer type solid state image sensor was indicated as the example for this embodiment, it is not limited to this. For example there is ample possibility for application with semiconductor integrated devices using interline type or frame-interline type solid state image sensors too.

The invention claimed is:

1. A semiconductor integrated device comprising:
    a light receiving sensor having on a semiconductor substrate, a light receiving section which receives light; and wherein a voltage is supplied through a pad electrode arranged along one edge of said semiconductor substrate;
    a light-shielding film which is formed on said semiconductor substrate and which shields at least other part of said light receiving section from light;
    a first wiring formed in the same layer as said light-shielding film, with one end connected to said pad electrode and an other end extended to a side edge of said semiconductor substrate;
    a second wiring arranged to go around a side face of said semiconductor substrate, and connected to said first wiring; and
    a sealing member which seals said solid-state image sensor.

2. A semiconductor integrated device according to claim 1, wherein said first wiring has at least two layers, and at least one of these at least plurality of layers is formed in the same layer as said light-shielding film.

3. A semiconductor integrated device according to claim 2, wherein in said first wiring at least one layer is formed in the same layer as said pad electrode.

4. A semiconductor integrated device according to claim 1, wherein said first wiring comprises aluminum containing copper.

5. A semiconductor integrated device according to claim 1, wherein said first wiring has a film thickness of no less than 2.0 μm and no more than 10 μm.

6. A semiconductor integrated device comprising:
    a light receiving sensor having on a semiconductor substrate, a light receiving section which receives light; and wherein a voltage is supplied through a pad electrode arranged along one edge of said semiconductor substrate;
    a light-shielding film which is formed on said semiconductor substrate and which shields at least other part of said light receiving section from light;
    a first wiring formed in the same layer as said light-shielding film, with one end connected to said pad electrode and an other end extended to a side edge of said semiconductor substrate;
    a second wiring formed in the different layer as said light-shielding film, connected to said first wiring, with one end extended to a side edge of said semiconductor substrate;
    a third wiring arranged to go around a side face of said semiconductor substrate, and connected to said second wiring; and
    a sealing member which seals said solid-state image sensor.

* * * * *